United States Patent [19]

Lelental et al.

[11] Patent Number: 5,116,812
[45] Date of Patent: May 26, 1992

[54] METHOD OF FORMING AN OXIDE SUPERCONDUCTING THIN FILM HAVING AN $R_1A_2C_3$ CRYSTALLINE PHASE OVER AN $R_2A_1C_1$ CRYSTALLINE PHASE

[75] Inventors: Mark Lelental; John A. Agostinelli; Henry J. Romanofsky, all of Rochester, N.Y.

[73] Assignee: Eastman Kodak Company, Rochester, N.Y.

[21] Appl. No.: 545,164

[22] Filed: Jun. 27, 1990

Related U.S. Application Data

[60] Division of Ser. No. 386,329, Jul. 28, 1989, Pat. No. 5,059,583, which is a continuation-in-part of Ser. No. 208,707, Jun. 20, 1988, abandoned, and a continuation-in-part of Ser. No. 236,420, Aug. 25, 1988, abandoned.

[51] Int. Cl.$^5$ .......................... B05D 5/12; B05D 3/02
[52] U.S. Cl. .......................... 505/1; 505/734; 427/62; 427/226; 427/126.3; 427/419.3
[58] Field of Search .................. 505/1, 734, 780; 427/62, 63, 226, 126.3, 419.3, 419.2

[56] References Cited

U.S. PATENT DOCUMENTS 4,826,808  5/1989  Yurek et al. .......................... 505/1

OTHER PUBLICATIONS

Rautioaho et al., "Studies to Prepare Superconducting Thick Films on Aluminum Oxide and Zirconium Oxide Substrates", Proc. SPIE-Int. Soc. Opt. Eng. 1988, 948 (High-Tc Supercond.) pp. 31–36.
Wu et al., "Study of High Temperature Oxide Superconductors", SPIE vol. 879 (Sens., Discrim., Signal Process. Supercond. Mater. Instrum.) (1988) pp. 130–134.
Frase et al., "Phase Compatibilities in the System $Y_2O_3$—BaO—CuO", Adv. Cer. Mat. vol. 2, No. 3B, Jul. 1987, pp. 295–302.
A. H. Hamdi, J. V. Mantese, A. L. Micheli, R. C. O. Laugal, & D. F. Dungan, "Formation of Thin-Film High $T_c$ Superconductors by Metalorganic Deposition", Appl. Phys. Lett., 51 (25), Dec. 21, 1987.
J. G. Bednorz & K. A. Miller, "Possible High $T_c$ Superconductivity in the Ba—La—Cu—O System", Z. Phys. B.-Condensed Matter, vol. 64, pp. 189–193 (1986).
C. W. Chu, P. H. Hor, R. L. Meng, L. Gao, Z. J. Huang, & Y. Q. Wang, "Evidence of Superconductivity Above 40 K in the La—Ba—Cu—O Compound System", Physical Review Letters, vol. 53, No. 4, pp. 405–407, Jan. 1987.
C. W. Chu, P. H. Hor, R. L. Meng, L. Gao, & Z. J. Huang, "Superconductivity at 52.5 K in the Lanthanum-Barium-Copper-Oxide System", Science Reports, vol. 235, pp. 567–569, Jan. 1987.
R. J. Cava, R. B. vanDover, B. Batlog, & E. A. Rietman, "Bulk Superconductivity at 36 K in $La_{1.8}Sr_{0.2}CuO_4$", Physical Review Letters, vol. 58, No. 4, pp. 408–410, Jan. 1987.
J. M. Tarascon, L. H. Greene, W. R. McKinnon, G. W. Hull, & T. H. Geballe, "Superconductivity at 40 K in the Oxygen-Defect Perovskites $La_{2-x}Sr_xCuO_{4-y}$", Science Reports, vol. 235, pp. 1373–1376, Mar. 13, 1987.
M. K. Wu, J. R. Ashburn, C. J. Torng, P. H. Hor, R. L. Meng, L. Gao, Z. J. Huang, Y. Q. Wang, & C. W. Chu, "Superconductivity at 93 K in a New Mixed-Phase Y—Ba—Cu—O Compound System at Ambient Pressure", Physical Review Letters, vol. 58, No. 9, pp. 908–910, Mar. 2, 1987.
H. Maeda, Y. Tanaka, M. Fukutom, & Y. Asano, "A New High $T_c$ Superconductor Without a Rare Earth Element", Japanese Journal of Applied Physics, vol. 27, No. 2, pp. L209 and L210.

Primary Examiner—Shrive Beck
Assistant Examiner—Roy V. King
Attorney, Agent, or Firm—Carl O. Thomas

[57] ABSTRACT

This invention is directed to a method of forming an article comprised of a substrate and an electrically conductive crystalline rare earth alkaline earth copper oxide thin film containing an $R_1A_2C_3$ crystalline phase over an $R_2A_1C_1$ crystalline phase, where $R_1A_1$ and C represent rare earth, alkaline earth, and copper, respectively.

18 Claims, 7 Drawing Sheets

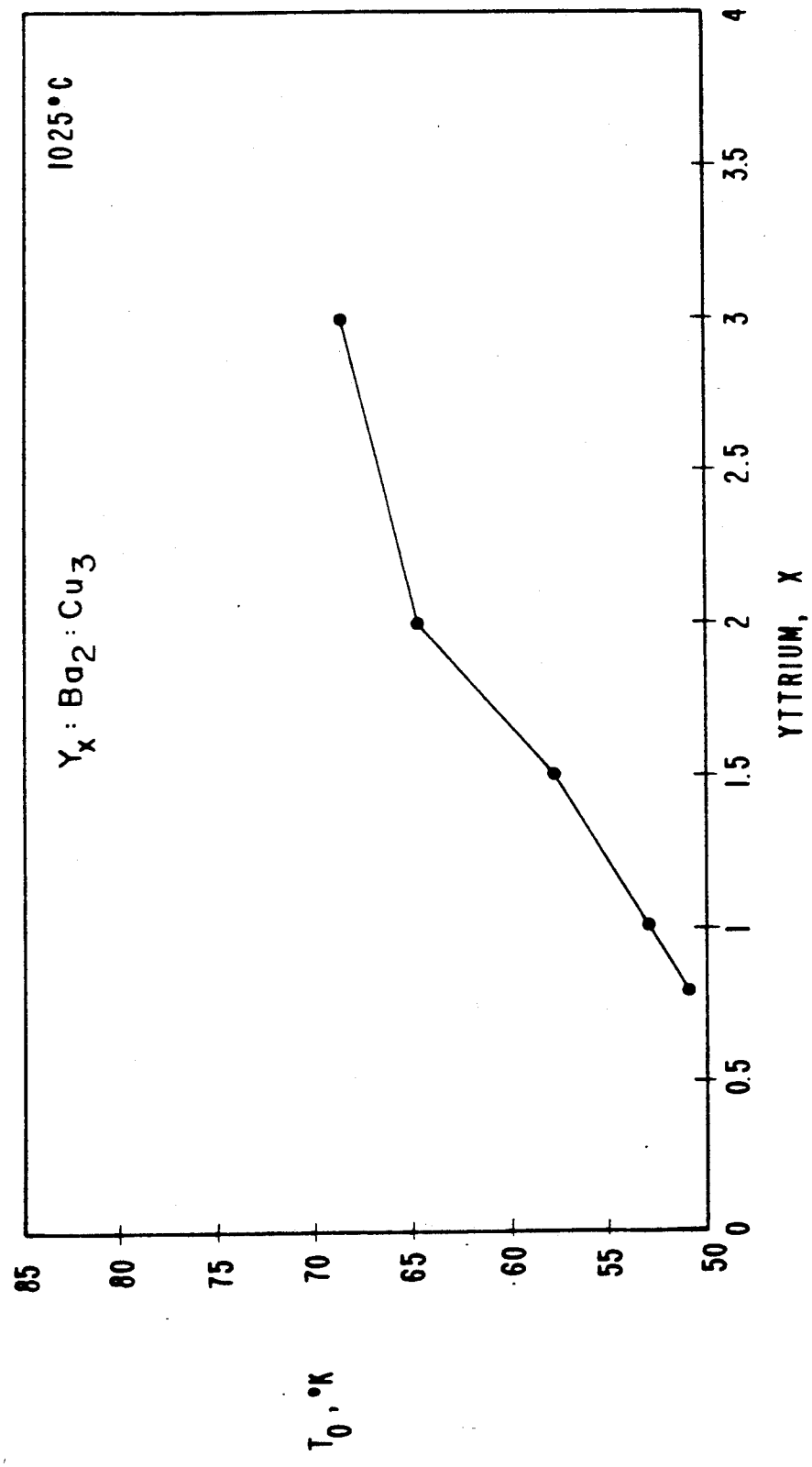

METHOD OF FORMING AN OXIDE SUPERCONDUCTING THIN FILM HAVING AN $R_1A_2C_3$ CRYSTALLINE PHASE OVER AN $R_2A_1C_1$ CRYSTALLINE PHASE

This is a division of Ser. No. 386,329, filed Jul. 28, 1989, now U.S. Pat. No. 5,059,583, which is a continuation-in-part of Ser. No. 208,707, filed Jun. 20, 1988, now abandoned and of Ser. No. 236,420, field Aug. 25, 1988, now abandoned.

FIELD OF THE INVENTION

The present invention relates to articles having conductive coatings. In certain preferred forms this invention relates to articles having superconductive coatings.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as $T_O$.

A. H. Hamdi, J. V. Mantese, A. L. Micheli, R. C. O. Laugal, and D. F. Dungan, "Formation of thin-film High $T_c$ Superconductors by Metalorganic Deposition", Appl. Phys. Lett., 51 (25), Dec. 27, 1987, reports the formation of 500 nm thin films of $YBa_2Cu_4O_z$ (z undetermined) on {100} $SrTiO_3$. A superconducting onset temperature ($T_c$) of 90° K. was measured with $T_o$ occurring at 37° K. When the process was repeated with $YBa_2Cu_3O_z$, both crystal sizes and $T_o$ where lower.

RELATED COMMONLY ASSIGNED CO-PENDING APPLICATIONS

Mir et al U.S. Ser. No. 329,049, filed Mar. 27, 1989, now U.S. Pat. No. 5,070,072 as a division of U.S. Ser. No. 46,593, filed May 4, 1987, now U.S. Pat. No. 4,880,770 titled CONDUCTIVE ARTICLES AND PROCESSES FOR THEIR PREPARATION, discloses articles containing an electrically conductive rare earth alkaline earth copper oxide thin film (<5 $\mu$m) and processes for their preparation.

Strom et al U.S. Ser. No. 68,391, filed Jul. 1, 1987, now U.S. Pat. No. 4,908,346 titled CONDUCTIVE THICK FILMS AND PROCESSES FOR FILM PREPARATION, discloses articles containing an electrically conductive rare earth alkaline earth copper oxide layer having a thickness of at least 5 $\mu$m and processes for their preparation.

Agostinelli et al U.S. Ser. No. 85,047, filed Aug. 13, 1987, now abandoned in favor of U.S. Ser. No. 330,409, filed Mar. 30, 1989, now U.S. Pat. No. 5,017,551, titled BARRIER LAYER CONTAINING CONDUCTIVE ARTICLES discloses articles as described above including a barrier layer interposed between the substrate and conductive layer containing a metal in its elemental form or in the form of an oxide or silicide chosen from the group consisting of magnesium, a group 4 metal, or a platinum group metal.

Hung et al U.S. Ser. No. 153,699, filed Feb. 8, 1988, now U.S. Pat. No. 4,908,348 titled BARRIER LAYER ARRANGEMENT FOR CONDUCTIVE LAYERS ON SILICON SUBSTRATES discloses articles having a silicon substrate and a conductive layer as described above additionally including a barrier layer triad consisting of silica as a first layer, a group 4 heavy metal oxide as a third layer, and a second layer interposed between the first and third layers of mixed composition.

Agostinelli, et al, U.S. Ser. No. 172,926, filed Mar. 25, 1988, titled CONDUCTIVE ARTICLES AND PROCESSES FOR THEIR PREPARATION discloses articles as described above wherein the conductive layers are of a crystalline heavy pnictide mixed alkaline earth copper oxide. U.S. Ser. No. 172,926 was abandoned in favor of U.S. Ser. No. 214,976, filed Jul. 5, 1988, which was in turn abandoned in favor of U.S. Ser. No. 359,306, now U.S. Pat. No. 4,950,643.

Agostinelli et al, Ser. No. 208,706, filed Jun. 20, 1988, now U.S. Pat. No. 4,956,335 titled CONDUCTIVE ARTICLES AND PROCESSES FOR THEIR PREPARATION discloses the use of a lift-off layer, e.g., a CuO layer between the substrate and the mixed metal oxide film. This layer insures removal of unwanted oxides upon patterning of the mixed metal oxide film by photoresist-chemical etch techniques.

In each of the aforementioned copending applications disclosing the preparation of conductive rare earth alkaline earth copper oxides, when the formation of a $R_1A_2C_3$ oxide crystalline phase is sought, the intent is to maximize the formation of that phase.

SUMMARY OF THE INVENTION

In one aspect, this invention is directed to an article comprised a substrate and an electrically conductive crystalline rare earth alkaline earth copper oxide thin film characterized in that the rare earth alkaline earth copper oxide thin film is comprised of an $R_1A_2C_3$ crystalline oxide phase formed over a $R_2A_1C_1$ crystalline oxide phase, where R, A, and C represent rare earth, alkaline earth, and copper, respectively.

The present invention makes available to the art thin film articles containing a specific two phase (i.e., $R_1A_2C_3$ phase over a $R_2A_1C_1$ phase) electrically conductive rare earth alkaline earth copper oxide system. In addition the present invention makes available to the art an electrically conductive article providing a two phase coating on a support having a superconducting transition temperature in excess of what is generally observed for the single $R_1A_2C_3$ phase system. Further, these articles are capable of being fabricated in any of the most commonly employed geometrical forms and patterns of electrically conductive elements as well as elongated flexible articles such as are employed for the fabrication of leads and windings in electrical circuits.

BRIEF DESCRIPTION OF THE DRAWINGS

These and other advantages of the invention can be better appreciated by reference to the following detailed description of preferred embodiments considered in conjunction with the drawings, in which

FIG. 8 is a plot of observed $T_o$ (°K.) versus yttrium concentrations for thin films sintered at 1025° C.

DESCRIPTION OF PREFERRED EMBODIMENTS

The present invention has as its purpose to make available electrically conductive articles exhibiting a rare earth alkaline earth copper oxide superconductive thin film (<5 μm) coated on a substrate and having improved $T_c$. The term "mixed rare earth alkaline earth copper oxide" refers to a composition of matter in the form of a mixture containing at least one rare earth element, at least one alkaline earth element, copper, and oxygen in the form of oxides and/or carbonates which are decomposable to form oxides. The rare earths contemplated for use in the practice of the invention are those known to form a $R_2A_1C_1$ crystalline oxide phase and/or a conductive $R_1A_2C_3$ crystalline oxide phase (where R, A, and C represent rare earth, alkaline earth, and copper, respectively)—i.e., yttrium, lanthanum, samarium, europium, gadolinium, dysprosium, holmium, erbium, thulium, ytterbium, and lutetium. The term "alkaline earth" indicates elements of Group 2 of the Periodic Table of elements as adopted by the American Chemical Society capable of forming a $R_1A_2C_3$ crystalline oxide phase—e.g., calcium, strontium and barium. Yttrium and barium are preferred rare earth and alkaline earth elements, respectively, for the practice of this invention.

The term "volatilization" of ligands as used herein includes thermal decomposition of the organic ligands.

In keeping with the established practice in the ceramics art of shortening lengthy chemical names of mixed metal oxides by substituting acronyms based on the first letters of the metals present, the term "RAC" is hereinafter employed to indicate generically rare earth-alkaline earth-copper oxides. When it is intended to designate specifically a lanthanide or yttrium as the rare earth component, L or Y, respectively, is substituted for R; and when it is intended to designate specifically strontium of barium as the alkaline earth component, S or B, respectively, is substituted for A. Also, to distinguish a mixture of oxides from the crystalline oxide compounds obtained upon high temperature heating of the mixed oxides, such resulting compounds may be designated as rare earth-alkaline earth cuprates.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed, although not required.

Figure 1:
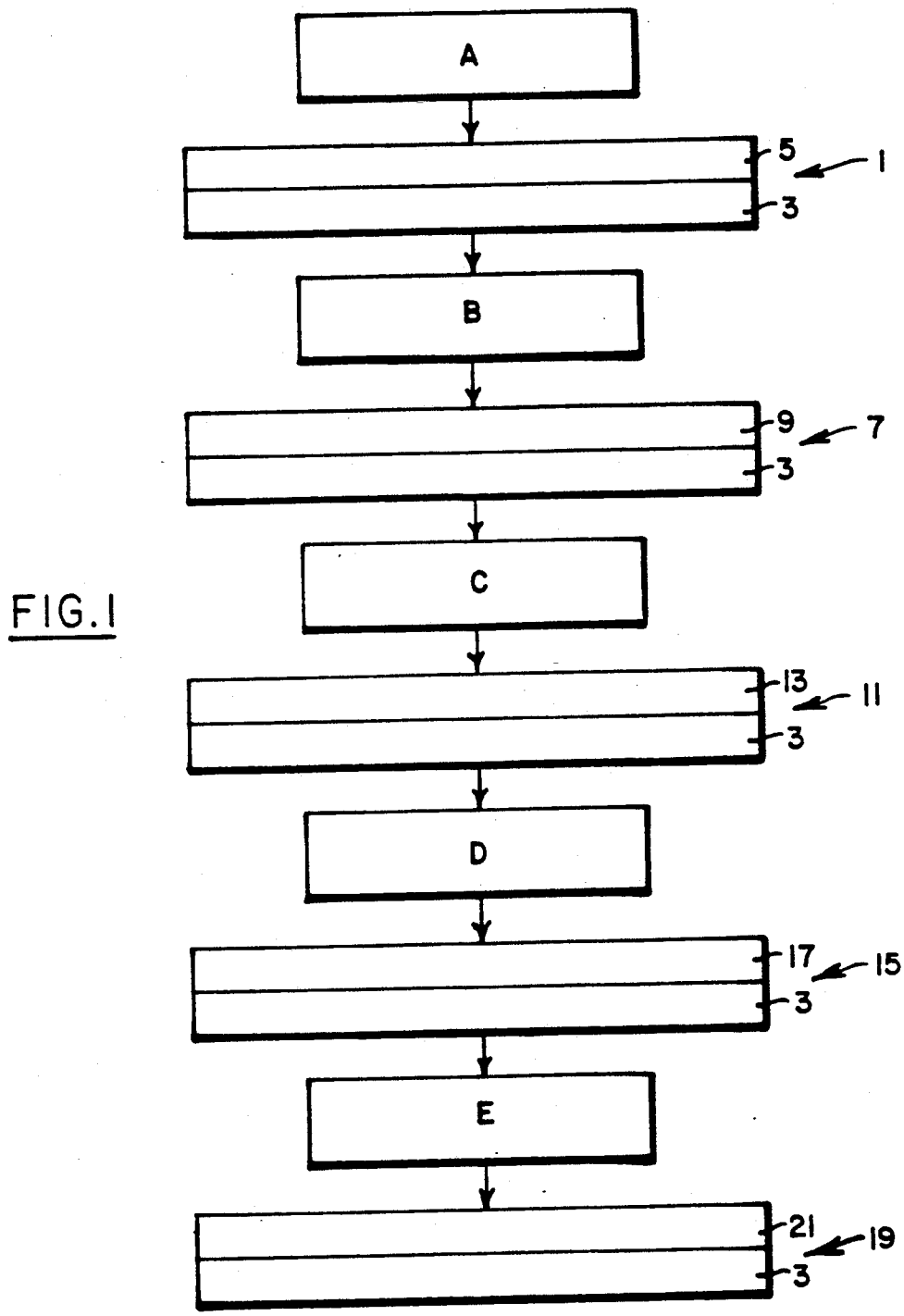
FIG. 1 is schematic diagram showing process steps and articles produced thereby.

The present invention can be appreciated by the schematic diagram shown in FIG. 1. In Step A of the preparation process, onto a substrate is coated a solution consisting essentially of a volatilizable film forming solvent and metal-ligand compounds of each of rare earth, alkaline earth, and copper containing at least one thermally volatilizable ligand. The resulting coated article 1 as schematically shown consists of substrate 3 and a layer 5 formed by mixed RAC oxide precursors (metal-ligand compounds) and film forming solvent.

In Step B article 1 is heated to a temperature sufficient to volatilize the ligands and the film forming solvent. The element 7 resulting consists of substrate 3 and a mixed RAC oxide layer 9. In this form the mixed RAC oxide coating exhibits relatively low levels of electrical conductivity.

To convert the mixed RAC oxide layer to a more highly conductive form it is necessary to induce RAC compound formation and crystal growth in the RAC compound layer. In Step C the article 7 is heated to a temperature sufficient to convert the mixed RAC oxide layer to a more electrically conductive crystalline form.

Using one preferred process, the temperature of heating in Step C is above that ordinarily employed in the formation of $R_1A_2C_3$ crystalline phase layers. More particularly, the mixed oxide layer is heated to a temperature beyond the melting point (typically about 1000° C.) of the $R_1A_2C_3$ crystalline oxide phase whereby the initially formed crystalline phase partially decomposes to form a mixed phase crystalline oxide layer comprised of elongated $R_2A_1C_1$ phase crystals having $R_1A_2C_3$ phase crystals on the surface thereof. The $R_1A_2C_3$ phase is preferably heated in the temperature range of from 1050° C. (optimally 1060° C.) to 1300° C.

At slow heating rates it is observed that initial crystallization of the mixed RAC oxide layer occurs in two stages-crystal nucleation and crystal growth of $R_1A_2C_3$ phase crystals. It is in some instances preferred to achieve crystal nucleation at a somewhat different temperature than is employed for crystal growth. After crystal growth, continued heating at a higher temperature melts and partially decomposes the $R_1A_2C_3$ phase to form a $R_2A_1C_1$ crystal phase. It is important to note that the resultant two phase system exhibits a higher superconducting $T_c$ than the crystalline $R_1A_2C_3$ film initially formed on the substrate prior to decomposition thereof. This thermal treatment which gives rise to the improved films is in opposition to the prior teachings which indicate that such temperatures should be avoided and that the lowest temperatures needed to attain compound formation and crystal growth of the $R_1A_2C_3$ phase should be employed. Where faster heating rates are employed, the formation of the multiphase RAC system need not follow the above sequence. The mixed RAC oxide film resulting from thermal decomposition of the metal-ligand precursors which, as previously indicated, may include a carbonate, e.g., barium carbonate, is generally not highly crystalline and typically contains a large fraction of amorphous material.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms such as are observed for the $R_1A_2C_3$ phase on the surface of the $R_2A_1C_1$ phase formed as described above are substituted for the spheres, the conducting particles can account for far less of the layer volume while still realizing satisfactory layer electrical conductivity. Similarly, electrical conductivity can be realized with a lesser proportion of conducting particles when the surrounding medium is also conductive.

Although satisfactory electrical conductivity can be realized with a lesser volume of crystalline $R_1A_2C_3$ phase, it is generally contemplated that in the embodiment of the invention where the crystallized RAC film comprises a first continuous layer having the crystallized $R_2A_1C_1$ phase and a second continuous layer thereover having the crystalline $R_1A_2C_3$ phase, the crystalline $R_1A_2C_3$ phase will account for at least 45 percent by volume and preferably at least 70 percent by volume of the total $R_1A_2C_3$ layer.

Microscopic examination of coatings of some single layer, two phase crystalline RAC compound compositions according to the present invention has revealed that extending heating temperatures beyond the melting point of the $R_1A_2C_3$ phase which first forms, results in formation of a network of interlaced green, rod-like crystals of the $R_2A_1C_1$ phase having on its surface the $R_1A_2C_3$ phase. The interlaced crystal network apparently allows for the conduction path through the two phase crystalline RAC compound layer. In this configuration percolation theory does not apply and therefore the amount of $R_1A_2C_3$ phase can be significantly lower than described above. From microscopic examination of RAC layers optimum heating times can be selected for maximizing both the proportion of the RAC layer accounted for by the superconducting $R_1A_2C_3$ crystalline phase in the desired configuration and networking of the crystals produced, thereby maximizing electrical conductivity and resulting in higher measured superconductive critical temperatures, $T_c$ and zero resistance temperatures $T_o$.

In alternative preferred process, one may deposit a first layer substantially comprised of the $R_2A_1C_1$ crystalline oxide phase and then, thereover form a second layer substantially comprised of the $R_1A_2C_3$ crystalline oxide phase. This is instead of a single mixed phase layer as described above. In this embodiment, the mixed oxide RAC layer is only heated to a temperature to form the conductive $R_1A_2C_3$ phase over the $R_2A_1C_1$ phase containing layer. In this procedure the $R_1A_2C_3$ phase is preferably formed in the temperature range of from 850° C. (preferably 950° C. and optimally 1000° C.) to 1050° C. An advantage of this approach is that the thin film produced can consist essentially of the $R_1A_2C_3$ and $R_2A_1C_1$ phases. If a higher temperature is employed, a portion of the $R_1A_2C_3$ phase will create additional $R_2A_1C_1$ phase, and the process of preparation will be a combination of the first and second preferred procedures.

The mixed crystalline oxide phases of the articles of this invention can be produced by still another preferred process. The metal-ligand compounds are coated with an atomic ratio of rare earth to alkaline earth of greater than 1.0:2.0, preferably in the range of from greater than 1.0:2.0 to 6.0:2.0. Heating in Step C is then undertaken at temperatures above 850° C., preferably above 950° C. Surprisingly, a mixture of $R_1A_2C_3$ and $R_2A_1C_1$ crystalline oxide phases form, even when sintering temperatures remain below those required for decomposition of the $R_1A_2C_3$ phase, to form a mixture $R_1A_2C_3$ and $R_2A_1C_1$ crystalline oxide phases. When heating temperatures are maintained below 1060° C., preferably below 1050° C., the excess of rare earth is entirely relied upon for formation of the $R_2A_1C_1$ crystalline oxide phase. The crystalline oxide phase mixture exhibits an increased $T_c$, just as the products of the two processes described above, but there are microscopically visible differences in the crystalline form of the mixture. The $R_2A_1C_1$ phase does not take the form of a network of rod-like crystals, as in the other preparation processes. The various processes are discussed in more detail in the examples, below.

When temperatures above the decomposition temperature of the $R_1A_2C_3$ crystalline oxide phase (e.g., above 1050° C., preferably above 1060° C.) are employed in combination with using an increased proportion of rare earth to alkaline earth (i.e., an atomic ratio of greater than 1.0:2.0), the techniques of both methods can be used together to form the desired mixture of $R_2A_1C_1$ and $R_1A_2C_3$ crystalline oxide phases.

In article 11 the RAC layer 13 on substrate 3 is crystalline having two crystalline phases, $R_2A_1C_1$ and $R_1A_2C_3$, regardless of which of the three different processes described above is employed.

Step D entails controlled cooling of the crystalline RAC compound layer from its crystallization temperature. By slowing the rate of cooling of the crystalline RAC compound layer imperfections in the crystal lattices can be reduced and electrical conductivity, which is favored with increasing order in the crystal structure, is increased. Cooling rates of 25° C. per minute or less are contemplated until the crystalline RAC layer reaches a temperature of at least 500° C. or, preferably, 200° C. Below these temperatures the lattice is sufficiently rigid that the desired crystal structure is well established. The article 15 produced is formed of the annealed crystalline RAC compound layer 17 on substrate 3.

While the article 15 exhibits high levels of electrical conductivity, in some instances further heating of the article 15 in an oxygen enriched atmosphere has been observed to increase electrical conductivity further. In addition to oxygen supplied from the ligands the oxygen forming the crystalline RAC compound layer is obtained from the ambient atmosphere, typically air. It is believed that in some instances, ambient air does not provide the proportion of oxygen needed to satisfy entirely the available crystal lattice sites.

Therefore, optional Step E entails heating the article 15 in an oxygen enriched atmosphere, preferably pure oxygen. The object is to equilibrate the RAC crystalline layer with the oxygen enriched atmosphere, thereby adding sufficient oxygen into the crystal lattice structure. Temperatures for oxygen enrichment of the crystalline RAC compound layer are above the minimum annealing temperatures employed in Step D described above. To be effective in introducing oxygen into the crystal lattice temperatures above those at which the lattice becomes rigid are necessary, preferably above 350° C. The duration and temperature of heating are interrelated, with higher temperatures up to 700° C. allowing shorter oxygen enrichment times to be employed. Substantially complete oxygen equilibration can be realized at near minimum temperatures in about 1 hour.

In preparing RAC layers shown to be benefitted by oxygen enrichment of the ambient atmosphere Step E can be consolidated with either or both of Steps C and D. Oxygen enrichment is particularly compatible with Step D, allowing annealing out of crystal lattice defects and correction of crystal lattice oxygen deficiencies to proceed concurrently.

The final electrically conductive article 19 is comprised of a two phase crystalline, electrically conductive RAC layer 21 on substrate 3. Depending upon specific choices of materials and preparation techniques, the article 19 can exhibit a high superconducting transition temperature, herein employed to designate a $T_c$ of greater than 30° C. and more particularly, a $T_c$ greater than previously observed for the equivalent single phase system. The article can also exhibit a high zero resistance temperature $T_o$, greater than 20° K., and more particularly a $T_c$ greater than previously observed for the equivalent single phase system.

The process described for preparing electrically conductive articles having crystalline RAC compound thin films offers several distinct advantages. One of the most significant advantages is that the proportions of rare earth, alkaline earth, and copper elements in the final RAC layer 21 exactly correspond to those present in the RAC precursor layer 5. In other words, the final proportion of rare earth, alkaline earth, and copper elements is determined merely by mixing in the desired proportions in the film forming solvent the metal-ligand compounds employed as starting materials. This avoids what can be tedious and extended trial and error adjustments of proportions required by commonly employed metal oxide deposition techniques, such as sputtering and vacuum vapor deposition. Further, the presently described process does not require any reduction of atmospheric pressures, and thus no equipment for producing either high or low vacuum.

A coating process particularly adapted to coating flexible substrates can be illustrated by reference to FIG. 2, wherein an elongated flexible substrate 25 is unwound from a supply spool 27 and passed downwardly over a guide roller 29 into a reservoir 31. The reservoir contains a film forming solvent with metal-ligand compounds dissolved therein, as described above in connection with Step A, shown as a liquid body 33. The flexible substrate is drawn over a lower guide roller 35 while immersed in the liquid and then passed upwardly to a third guide roller 37.

As the flexible substrate is drawn upwardly it emerges from the liquid body bearing an annular thin, uniform surface layer corresponding to layer 5 in FIG. 1. Between the reservoir and the third guide roller the coated substrate is drawn through a heating zone to complete in different regions of the heating zone process Steps B, C, D, and E sequentially, as previously described. To accommodate needs for different residence times within the various heating regions the lengths of the different regions can be adjusted. Additionally, residence time of a substrate within any heating region can be further increased by employing laterally diverting guides, so one or a number of coated substrate festoon-like path diversions are created within the heating region.

After passing over the third guide roller the substrate, bearing an annular crystalline electrically conductive RAC layer according to the present invention is wound onto a storage spool 39. Where the RAC layer is coated on a flexible substrate, it is preferred to maintain the thickness of the RAC layer at 2 $\mu$m or less, preferably 1.0 $\mu$m or less, so that it exhibits adequate flexibility.

Flexing of the RAC layer required by guiding and spooling by can be reduced by increasing the radius of curvature imposed by the third guide roller and storage spool.

Figure 2:
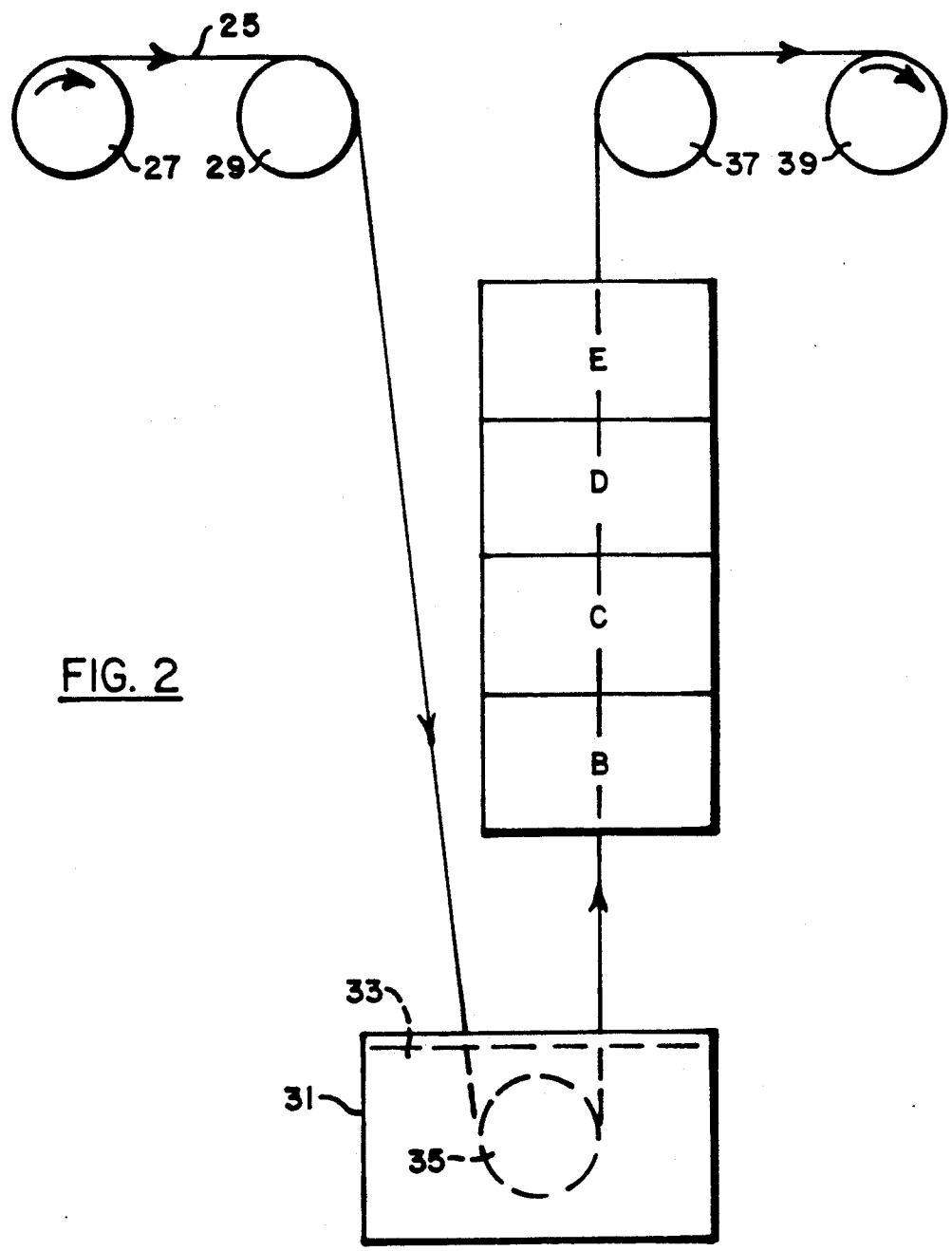
FIG. 2 is a schematic diagram of an arrangement for coating an elongated flexible substrate.

The arrangement shown in FIG. 2 for applying a flexible RAC layer to a flexible substrate is, of course, merely illustrative of a number of approaches which can be employed to apply a RAC layer to a flexible substrate. Where it is more convenient to perform process steps B, C, D, and E in a horizontally offset rather than vertically offset spatial relationship, instead of applying the RAC precursors and film forming solvent by immersion of the substrate, other conventional coating approaches can be employed for application, such as roll coating, spraying, brushing, curtain coating, extrusion, or the like. It is generally preferred to avoid guide contact of the coated substrate between application of the RAC precursors and completion of Step B. However, once a solid RAC layer exists on the substrate, guide contact with the substrate within or between any one of process Step C, D, and E locations can be undertaken, as desired for convenient spatial orientation.

Additionally, it will be understood that multiple layers can be produced, e.g., a flexible substrate containing a $R_2A_1C_1$ phase layer and a $R_1A_2C_3$ layer thereover can be produced by passing the substrate coated with the first layer back through the system or through a second similar system for producing the second ($R_1A_2C_3$) layer thereover.

While flexible electrical conductors of extended length serve a variety of important applications, there are many other applications for electrical conductors, particularly those located on limited portions of substantially planar surfaces of substrates. Such applications include those served by conventional printed, integrated, and hybrid circuits. In such circuits limited, if any, flexibility of the electrical conductor is required, but an ability to define areally—i.e., pattern, the electrical conductor with a high degree of precision is in many instances of the utmost importance. The present invention is compatible with precise patterning of the electrical conductor on a substrate surface.

Figure 3:
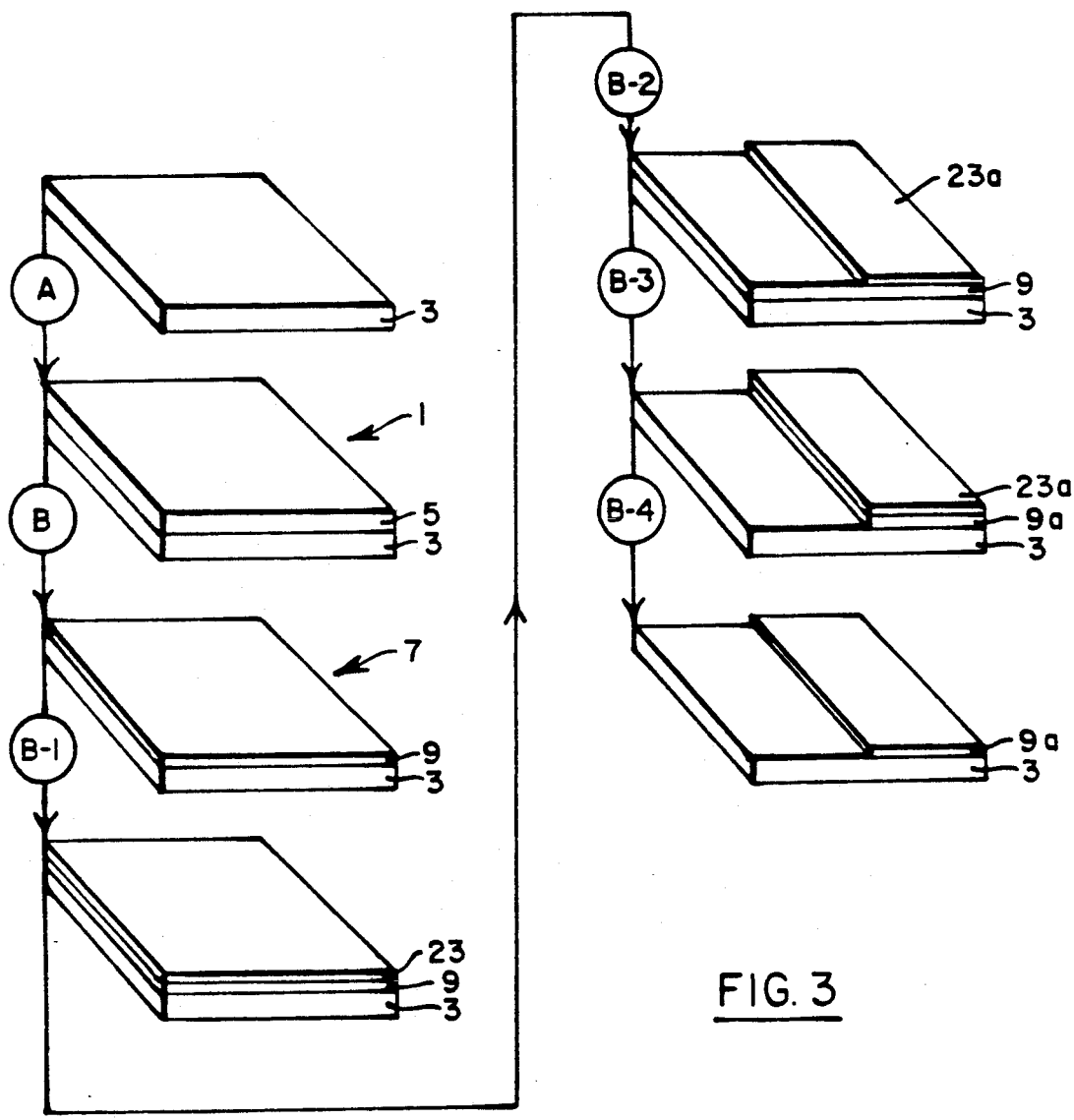
FIG. 3 is a schematic diagram of process steps and articles formed thereby capable of forming a patterned conductor on a substrate.

Patterning of an electrical conductor according to this invention is illustrated by reference to FIG. 3. Substrate 3 is coated on its upper planar surface with a uniform RAC precursor layer 5 as described above in connection with process Step A to form initial coated article 1. Process Step B, described above, is performed on article 1 to produce article 7, described above, comprised of a mixed RAC oxide layer 9 and substrate 3.

The mixed RAC oxide layer lends itself to precise pattern definition and produces results generally superior to those achieved by patterning the mixed RAC oxide precursor layer from which it is formed or the crystalline RAC compound layer which is produced by further processing. The RAC precursor layer is often liquid before performing process Step B and is in all instances softer and more easily damaged in handling than the mixed RAC oxide layer. The crystalline RAC compound layer cannot be etched with the same boundary precision as the mixed RAC oxide layer, since etch rates vary from point to point based on local variations in the crystal faces and boundaries presented to the etchant. Patterning of either the RAC oxide precursor layer or the crystalline RAC compound layer is specifically recognized as a viable alternative to patterning the mixed RAC oxide layer for applications permitting more tolerance of conductor dimensions. For example, screen printing the RAC precursor layer on a substrate to form a printed circuit is specifically contemplated.

While the mixed RAC oxide layer can be patterned employing any conventional approach for patterning metal oxides, for more precise edge definitions the preferred approach is to photopattern the mixed RAC oxide layer employing any of the photoresist compositions conventionally employed for the precise definition of printed circuit or integrated circuit conductive layers. In a preferred form of the process, a uniform photoresist layer 23 is applied to the mixed RAC oxide layer 9 as indicated by process Step B-1. The photoresist layer can be formed by applying a liquid photoresist composition to the substrate, spinning the substrate to insure uniformity of the coating, and drying the photoresist. Another approach is to laminate a preformed photoresist layer supported on a transparent film to the mixed RAC oxide layer.

The photoresist layer is then imagewise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step B-2. Following this step patterned photoresist layer 23a is left on a portion or portions of the mixed RAC oxide layer 9. Although the patterned residual photoresist layer is for convenience shown of a simple geometrical form, it is appreciated that in practice the patterned photoresist can take any of a wide variety of geometrical forms, including intricate and thin line width patterns, with line widths ranging into the sub-micrometer range.

Following patterning of the photoresist layer, portions of the RAC layer which are not protected by the photoresist can be selectively removed by etching, as indicated by process Step B-3. This converts the mixed RAC oxide layer 9 to a patterned mixed RAC oxide layer 9a confined to areas corresponding to that of the photoresist.

Following patterning of the mixed RAC oxide layer the patterned photoresist is removed, as indicated by process Step B-4. The final article as shown in FIG. 3 consisting of the substrate 3 and patterned mixed RAC oxide layer 9a is then further processed as indicated in FIG. 1, picking up with process Step C. The crystalline RAC compound layer formed in the final product conforms to the patterned mixed RAC oxide layer.

In order to obtain an improved photoresist patterned article it is contemplated to employ an underlying lift-off layer, e.g., a CuO layer, as taught in Agostinelli et al U.S. Pat. No. 4,956,335, cited above.

In the process of preparing a patterned article described above it is noted that once an article is formed having a mixed RAC oxide layer on a substrate it can be patterned to serve any of a wide variety of circuit applications, depending upon the circuit pattern chosen. It is therefore recognized that instead of or as an alternative to offering patterned articles for sale a manufacturer can instead elect to sell articles with an unpatterned mixed RAC oxide layer, with or without an unpatterned photoresist layer, to subsequent fabricators. It will often be convenient in this instance to locate a removable layer or film over the mixed RAC oxide layer for its protection prior to further fabrication. The subsequent fabricator can undertake the patterned exposure and further processing required to produce a finished electrically conductive article.

To crystallize a mixed RAC oxide layer and to perform the optional, but preferred annealing and oxygen enrichment steps both the substrate and mixed RAC oxide layer are heated uniformly. This can be done employing any conventional oven. In some instances, however, either to protect the substrate from rising to the peak temperatures encountered by the RAC layer or simply to avoid the use of an oven by fabricator, it is contemplated that the RAC layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the RAC layer, allowing it to be brought to its crystallization temperature without placing the substrate in an oven.

A diverse approach for producing patterned electrical conductors can be practiced by employing article 7 comprised of the uniform mixed RAC oxide layer 9 and substrate 3 as a starting element. Instead of patterning the mixed RAC oxide layer followed by crystallization of the remaining portions of the layer, the mixed RAC oxide layer is imagewise addressed to produce compound formation and crystal growth and two phase formation selectively only in areas intended to be rendered electrically conductive. For example, by addressing the mixed RAC oxide layer with a laser, areas directly impinged by the laser beam can be selectively crystallized to a two phase electrically conductive form leaving the remaining mixed RAC oxide areas unaffected. To define the conductive pattern generated it is only necessary to control the path of the laser beam.

It is, of course, recognized that additional heating for purposes of annealing or oxygen saturation can be undertaken, following lamp or laser crystallization, by heating in any desired manner. One approach is to heat at least mixed oxide layer 9 of the article 7 to a temperature above its minimum annealing temperature and then laser address the heated article. This facilitates annealing and oxygen enrichment without requiring uniformly heating the entire article to the significantly higher levels otherwise required for crystal nucleation and growth.

Another variation on the laser patterning approach is to follow the laser responsible for crystallization with one or more passes from a lower intensity laser beam to retard the rate of cooling and thereby enhance annealing. For example, a laser beam can be swept across an area of the substrate surface to produce the desired crystal formation and then reduced in intensity or defocused and swept back across the same area to facilitate annealing. By defocusing the laser beam on subsequent passes over the same area the laser energy is spread over a larger area so that the maximum effective temperature levels achieved are reduced. The advantage of employing one laser for multiple passes is that alignments of laser beam paths are more easily realized. Additionally or alternatively, the rapidity with which the laser is swept across the exposed area can be adjusted to control the temperature to which it heats the RAC layer and in turn the relative ratio of the $R_2A_1C_1$ phase to the $R_1A_2C_3$ phase. Other laser scanning variations are, of course, possible.

Both lamp heating and laser scanning allow a broader range of substrates to be considered, particularly those which, though capable of withstanding ligand and solvent volatilization temperatures, are susceptible to degradation at crystallization temperatures. By choosing wavelengths in spectral regions to which the mixed RAC oxide layer is opaque or at least highly absorbing, direct radiant heating of the substrate can be reduced or eliminated. In this instance the bulk of the radiation is intercepted in the RAC layer before it reaches the substrate. The substrate can also be protected from direct radiant heating by choosing a substrate composition that is transparent to or minimally absorptive of the laser radiation. Since lasers emit coherent electromagnetic radiation of a single wavelength, high selectivity of absorption or transmission is much more readily achieved than when absorption or transmission must be averaged over a wavelength region of the spectrum.

In considering crystallization of a RAC layer by radiant energy to which the RAC layer is opaque or at least highly absorptive and employing a substrate which is substantially transparent to the radiant energy, whether supplied from a lamp or laser, advantages can be realized by supplying the radiant energy to the RAC layer through the substrate. Where a substantially transparent substrate is employed, little of the radiant energy is attenuated in traversing the substrate. The RAC layer adsorbs the radiant energy adjacent its interface with the substrate. Thus, crystallization of the RAC layer can be initiated at this interface. By choosing a substrate of a crystal structure and chemistry compatible with that of the crystals to be formed in the RAC layer, crystal growth in the RAC layer can occur epitaxially at the interface of the RAC layer and the substrate. Generally, in one form the substrate can be of the same crystalline form sought in the RAC layer—e.g., a $R_1A_2C_3$ crystalline form or a $R_2A_1C_1$ crystalline form. However, it is not essential that the substrate have the same crystal structure as the RAC layer for epitaxial deposition to occur. What is generally most important is that the substrate present a surface for deposition of the conductive crystalline RAC layer that at least approximates the spatial frequency of atoms favorable for epitaxy. For example, it is possible to slice a monocrystalline substrate so that it presents a planar surface having a frequency and spacing of oxygen atoms approximating that in the desired crystalline phase of the RAC layer. The spatial frequency of oxygen atoms at the surface of the substrate can be chosen to match or approximate that of a tetragonal $K_2NiF_4$ or $R_1A_2C_3$ crystalline form, for instance, even though the substrate takes a different crystalline form. Notwithstanding the foregoing, it has been found that a monocrystalline magnesia (periclase) substrate and particularly a MgO substrate having a {100} crystal surface is preferred. In fact, some other substrates suitable for a single phase $R_1A_2C_3$ product have not yielded articles with high and enhanced $T_c$ and $T_o$ as taught herein using the novel mixed two phase layer.

To avoid coating imperfections the thickness of a mixed RAC oxide layer produced in a single process sequence is maintained at 1 micron or less, preferably 0.6 micron or less, and optimally 0.4 micron or less, a single process sequence being understood to constitute the steps described above for forming a mixed RAC oxide layer. By repeating the process sequence one or more times a mixed RAC oxide layer of any desired thickness can be built up. It is generally preferred to repeat this sequence three to ten times to achieve sufficient thickness to minimize substrate interaction effects.

As taught in the aforementioned copending applications, which are incorporated herein by reference, while ideal substrates are those which remain chemically nonreactive during fabrication of the conductive crystalline RAC compound layer, in practice when RAC crystallization temperatures are encountered by the substrate at least some interaction of the RAC layer occurs with all but the most stable of substrates. In some instances less than hoped for levels of electrical conductivity have been observed, believed to be attributable to interaction of the crystallized RAC layer with its substrate at their mutual interface. Unwanted reductions in $T_c$ and $T_o$ are believed to be unwanted manifestations of substrate interaction with the crystalline RAC compound layer. Such degradation has been observed, for example, when employing alumina, silicon, and quartz as the substrate material for RAC compound layers.

In any event, to minimize unwanted interaction of the RAC layer with the substrate it is specifically contemplated to interpose a barrier between the substrate and the RAC layer. It has been observed that each time the the process sequence required for forming the mixed RAC oxide layer is repeated before proceeding on to the crystallization step of the process, substrate interaction with the crystalline RAC compound layer is reduced, as reflected in its electrical conductivity properties, even where microscopic examination reveals individual grains or microcrystals extending from at or near the substrate to the top of the RAC layer. In this instance the portion of the crystalline RAC compound layer adjacent the substrate is acting as a barrier protecting the portion of the RAC layer remote from the substrate.

An alternative is to interpose between the substrate and the crystalline RAC compound layer a barrier of a different composition. The interposed barrier layer can itself take the form of a crystalline RAC compound layer, differing in the specific RAC composition chosen. In this instance the barrier layer can be viewed as a second crystalline RAC compound layer, which can, if desired, perform electrical conduction as well as acting as a barrier. Or the substrate can have an $R_2A_1C_1$ layer which may act as a barrier but more importantly can act as a substrate which provides a matrix on which an overlying $R_1A_2C_3$ layer can be formed.

In other instances the barrier can be viewed as an extension of the substrate. For example, a ceramic substrate coated with a thin refractory metal layer or a semiconductor substrate coated with an oxide or nitride, each of which are in turn overcoated with a crystalline RAC compound layer, can be viewed as an article having a composite substrate supporting a crystalline RAC compound layer or an article having a unitary substrate, a crystalline RAC compound layer, and an interposed barrier.

To facilitate formation of the most highly uniform crystalline RAC compound layers it is preferred that the substrate itself be monocrystalline. Monocrystalline strontium titanate, alumina (sapphire) and magnesia (periclase) are all readily available substrate materials. Semiconductor wafers, particularly silicon and III-V compound wafers, may also constitute useful classes of monocrystalline substrates for the articles of this invention. However an appropriate barrier layer may be required.

A preferred barrier layer is magnesium oxide.

One barrier layer arrangement specifically contemplated for silicon substrates is wherein a barrier layer triad is interposed between a conductive layer and a silicon substrate. The barrier layer triad is comprised of a first triad layer located adjacent the silicon substrate consisting essentially of silica, a third triad layer removed from the silicon substrate consisting essentially of at least one Group 4 heavy metal (i.e., zirconium or hafnium) oxide, a second triad layer interposed between the first and third triad layers consisting essentially of a mixture of silica and at least one Group 4 metal oxide. This barrier layer protects the silicon substrate from contamination by the overlying conductive layer, particularly against copper contamination and protects the conductive layer from silicon contamination. This barrier layer arrangement is disclosed by Hung et al U.S. Pat. No. 4,908,348, cited above.

Alkaline earth containing oxides and particularly magnesium oxide constitute a particularly preferred class of substrates. They are in general relatively inert, refractory materials which exhibit limited interaction with the RAC layers during their formation. Strontium titanate, in a perovskite crystalline form would ordinarily be considered as a suitable alkaline earth containing oxide substrate material. However, interaction between the substrate and the contiguous RAC layer is believed to occur when the article is heated to temperatures above about 900° C. thereby degrading the RAC layer. Such interaction effects may be minimized by employing the interposed barrier formation techniques, described above, e.g., employing an MgO barrier layer over the strontium titanate. It is generally preferred to perform the mixed RAC oxide layer formation processing sequence three to ten times to achieve sufficient thickness to minimize substrate interaction effects. Alumina is another example of specifically contemplated oxide substrate.

To facilitate formation of the most highly uniform crystalline RAC compound layers it is preferred that the substrate itself be monocrystalline. Monocrystalline strontium titanate, alumina (sapphire) and magnesia (periclase) are all readily available substrate materials. Semiconductor wafers, particularly silicon and III-V compound wafers, may also constitute useful classes of monocrystalline substrates for the articles of this invention. However an appropriate barrier layer may be required.

Another specifically contemplated class of substrate materials are refractory metals. Such metals are, of course, well suited to withstanding RAC layer crystallization temperatures of 1000° C. or more. Refractory metals such as tungsten, tantalum, titanium, and zirconium are particularly contemplated. The refractory metal can form the entire substrate or a thermally resistant layer onto which the RAC layer is coated.

In the process of fabrication of this invention the formation of the desired RAC layer begins with the formation of a RAC precursor layer, such as layer 5 in article 1, shown in FIG. 1. To form the precursor layer a solution of a film forming solvent, a rare earth metal compound, an alkaline earth metal compound, and a copper compound is prepared. Each of the rare earth, alkaline earth, and copper compounds consists of metal ion and one or more ligands. Most useful metal ligand compounds (e.g., metal organic compounds) thermally decompose to form metal oxides, however, some metal compounds, in particular some alkaline earth organic compounds, form metal carbonates on decomposition. Higher temperatures are then required to convert the carbonates to oxides. A ligand oxygen atom bonded directly to a metal is often retained with the metal in the RAC layer, although other ligand oxygen atoms are generally removed. At least 95 percent of the ligands and their component atoms other than oxygen are preferably outgassed at temperatures of less than 600° C. On the other hand, to avoid loss of materials before or during initial coating of the metal-ligand compounds, it is preferred that the metal-ligand compounds exhibit limited, if any, volatility at ambient temperatures. Metal-ligand compounds having any significant volatility below their decomposition temperature are preferably avoided in the practice of this invention.

Metalorganic (including metallo-organic and organometallic) compounds, such as metal alkyls, alkoxides, $\beta$-diketone derivatives, and metal salts of organic acids—e.g., carboxylic acids, constitute preferred metal-ligand compounds for preparing RAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to volatilize the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of rare earth, alkaline earth, and copper ions sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of the rare earth, alkaline earth, or copper elements to be incorporated in the RAC layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline RAC compound layer. The rare earth, alkaline earth, and copper can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired crystalline RAC compound layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

As discussed above, depending upon the specific choice of the three alternative preparation processes, sintering temperatures and the ratio of starting materials can be varied. Except as specifically indicated above, the ratios of starting materials and sintering temperatures can be within the ranges disclosed by Mir et al published European Patent Application 0 290 357, corresponding to Mir et al Ser. No. 46,593, now U.S. Pat. No. 4,880,770, cited above, and here incorporated by reference.

Following formation of the $R_1A_2C_3$ and $R_2A_1C_1$ (e.g., $Y_1B_2C_3$ and $Y_2B_1C_1$) phases by heating the electrically conductive layer is cooled slowly at a rate of 25° C. or less per minute until it reaches a temperature of 700° to 350° C., preferably 550° to 450° C. The electrically conductive layer is then held at this temperature or reheated to this temperature following cooling in the presence of oxygen (e.g., an oxygen atmosphere) until oxygen equilibration is substantially complete, typically about 20 to 120 minutes.

The processes of preparing the articles of this invention can be better appreciated by reference to the working examples.

EXAMPLES

The following $Y_x$:$Ba_2$:$Cu_3$ metallo-organic precursor solutions were prepared by dissolving the appropriate quantities of the respective yttrium, barium and copper carboxylates and rosin in a 2-ethylhexanoic acid-toluene solvent mixture. The solutions were refluxed for 5 minutes, allowed to cool to room temperature and then filtered using a 1.2 μm filter.

YBC-P1 $Y_1$:$Ba_2$:$Cu_3$

Following the above procedure 4.089 g yttrium tri(2-ethylhexanoate), 8.125 g barium di(cyclohexane butyrate) 8.26 g copper di(2-ethylhexanoate) and 14.0 g rosin were dissolved in a solvent mixture consisting of 30.4 g 2-ethylhexanoic and 4.0 g toluene. This solution results in an atomic ratio of Y:Ba:Cu of 1:2:3.

YBC-P2 $Y_{1.5}$:$Ba_2$:$Cu_3$

Utilizing 6.134 g of the yttrium tri(2-ethylhexanoate) and otherwise following the quantities and procedure as set forth with respect to YBC-P1, a precursor solution having an atomic ratio of Y:Ba:Cu of 1.5:2:3 is formed.

YBC-P3 $Y_{2.0}$:$Ba_2$:$Cu_3$

Utilizing 8.178 g of the yttrium tri(2-ethylhexanoate) and otherwise following the quantities and procedure set forth above, a precursor solution having an atomic ratio of Y:Ba:Cu of 2.0:2:3 is formed.

YBC-P4 $Y_{3.0}$:$Ba_2$:$Cu_3$

Utilizing 12.267 g of the yttrium tri(2-ethylhexanoate) and otherwise following the quantities and procedure set forth above, a precursor solution having an atomic ratio of Y:Ba:Cu of 3:2:3 is formed.

Details of the preparation and performance of articles according to this invention are illustrated by the following examples.

YBC-P5 $Y_{2.0}$:$Ba_1$:$Cu_1$

Utilizing 1.63 g of the yttrium tri(2-ethylhexanoate), 0.812 g barium di(cyclohexane butyrate) 0.551 g copper di(2-ethylhexanoate) and 2.78 g rosin were dissolved in a solvent mixture consisting of 6.08 g 2-ethylhexanoic and 0.8 g toluene. This solution results in an atomic ratio of Y:Ba:Cu of 2:1:1.

EXAMPLE 1

This example illustrates the preparation of a high $T_c$ electrically conductive article prepared by forming an YBC layer on a {100} face of a single crystal MgO (periclase) substrate.

A coating was produced on the substrate by applying the YBC-P1 precursor solution to the substrate and spinning the substrate at 2,000 rpm for 20 seconds producing a uniform smooth coating. The coated substrate was then heated in air to 650° C. and held at this temperature for five minutes to vaporize the solvents and decompose the carboxylates. A uniform mixed oxide layer resulted. The coating-heating process was repeated nine times to build up the thickness of the mixed oxide layer which consisted primarily of yttrium oxide, copper oxide and barium carbonate.

The final mixed oxide layer was converted to an electrically conductive crystalline $YBa_2Cu_3O_{7-x}$ single phase film by heating in air at 1025° C. for three minutes.

The crystalline film was then cooled slowly at a rate of about 6° C. per minute. After cooling to room temperature the sample was reheated in oxygen at 450° C. for one hour and then again cooled slowly at about 6° C. per minute.

X-ray diffraction analysis of the Y—Ba—Cu layer confirmed that it exhibited a well defined perovskite structure corresponding to $YBa_2Cu_3O_{7-x}$ phase with no evidence of a second phase.

The standard four-probe technique was used to measure film resistance as a function of temperature. Contacts were made using gold bonding pods fabricated by pyrolysis of gold organometallic precursor (Liquid Bright Gold ™ —Englehard Corp.).

EXAMPLES 2 THROUGH 5

The Y—Ba—Cu—O films of these examples were prepared and characterized as described in Example 1, except that the high temperature annealing was carried out in the 1045° C.-1100° C. temperature range as set forth in Table I.

TABLE I

| Example | Annealing Temperature °C. |
|---|---|
| 2 | 1045 |
| 3 | 1052 |
| 4 | 1075 |
| 5 | 1100 |

Films annealed at temperatures at or above about 1075° C. show appearance of new rodlike features. Subsequent characterization of the 1075° C. and 1100° C. films using optical microscopy, Raman spectroscopy, scanning electron microscopy and energy-dispersive x-ray microanalysis revealed broad morphological, structural and compositional inhomogeneities.

Glancing-angle (Theta=1°) x-ray diffraction data of the 1075° C. sample providing information on the identity of surface phase(s) show the single phase orthorhombic structure corresponding to $YBa_2Cu_3O_{7-x}$. A closer examination of the x-ray diffraction pattern of preferred films indicated that there is a high degree of (OkO) preferred orientation wherein K refers to reflections corresponding to the long dimension of the unit cell. This is evidenced by comparing the intensities of (010), (020), (001/030), and (130/101) peaks in the film with those from the randomly oriented powders. However, the T/2T x-ray diffraction pattern of the same samples providing information on the identity of the bulk phase(s) shows the polyphase structure containing at least $Y_2BaCuO_5$ and $YBa_2Cu_3O_{7-x}$ phases.

Moreover, there is considerable evidence that the two-phase structures are being formed with $Y_2BaCuO_5$ phase functioning as a substrate for the $YBa_2Cu_3O_{7-x}$ superconducting layer.

Figure 4:
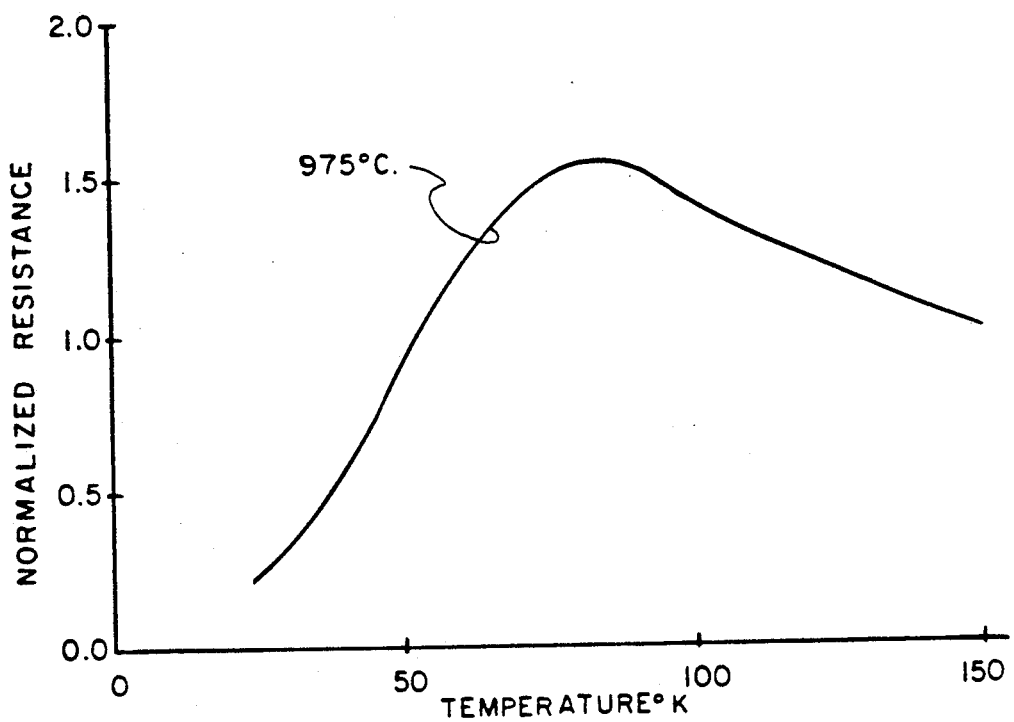
FIGS. 4 and 5 are plots of temperature in degrees Kelvin versus resistance, as normalized for the resistance at 150° K.

Results of electrical resistance measurements for the film prepared as set forth in Example 1 are shown in FIG. 4. Here the temperature dependence of the resistance is characterized by two distinct regions. In the first region which extends from 150° K. to 85° K., the resistance increases as the temperature decreases. This temperature dependence is similar to that observed for semiconducting materials. In the second region (T<85° K.) one can observe the onset of a superconductive state, however, the transition is very broad and the sample does not show a zero resistance state even at the lowest measurement temperature, i.e., 25° K.

Figure 5:
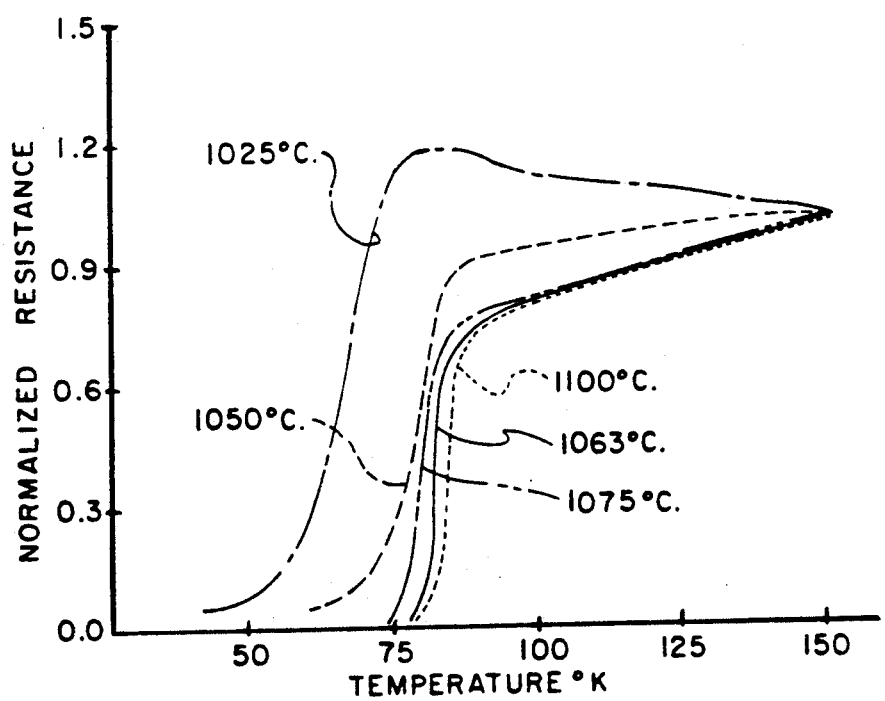

The temperature dependence of the resistance of films annealed as described in Table I (Examples 2-5) is shown in FIG. 5. As can be seen, both the 1075° C. and 1100° C. samples show higher onset temperatures, sharper transitions and higher zero resistance temperatures than films annealed at lower temperatures which do not exhibit the rod like features and two-phase structure.

EXAMPLE 6

This example illustrates the preparation of a high $T_c$ electrically conductive article prepared by first forming a crystalline $Y_2B_1C_1$ phase layer on a {100} face of a MgO substrate and subsequently forming a crystalline $Y_1B_2C_3$ phase layer over the $Y_2B_1C_1$ layer.

In accordance with this method, a first coating was applied to the substrate by spin coating the YBC-2 precursor solution at 4000 rpm for 20 seconds. This coating was then heated in air at 650° C. for 5 minutes. A mixed oxide YBC film resulted. This coating-heating procedure was repeated 9 times to form a first composite mixed oxide layer.

The first composite mixed oxide layer was then heated at 1025° C. for 3 minutes thereby converting it to a continuous crystalline $Y_2BaCuO_5$ layer. A second coating to form a mixed metal oxide film ($Y_1:Ba_2:Cu_3$) was formed utilizing the YBC-1 precursor as described in example 1. This mixed oxide RAC film was then heated at 1063° C. for 3 minutes to form a crystalline $Y_1Ba_2Cu_3O_{7-x}$ film. The crystalline film was then cooled slowly (6° C./min.) and annealed in oxygen as described in Example 1.

Resistance measurements of the superconducting $Y_1Ba_2Cu_3O_{7-x}$ layer formed in this manner also exhibited a higher $T_c$ and $T_o$ than that of a $YBa_2Cu_3O_{7-x}$ film grown directly on the MgO substrate at 1025° C. in the absence of the $Y_2BaCuO_5$ layer.

The morphological, structural and compositional features as well as superconducting properties of the Y—Ba—Cu—O ceramic films described herein are expected to vary with the stoichiometry, substrates and thermal history. A variety of precursors and substrates are useful to control the final composition and structure. It is expected that the spin-on-ceramic processes will provide high degree of control of composition, morphology and microstructure of these thin films. The fabrication of the multiphase superconducting Y—Ba—Cu—O thin film structures with $Y_2BaCuO_5$ films functioning as the substrates for the superconducting $YBa_2Cu_3O_{7-x}$ phases is expected to result in significant improvements in the superconducting transition and zero resistance temperatures as well as the critical current densities.

EXAMPLE 7

This example illustrates the preparation of an electrically conductive article prepared by forming a crystalline $YBa_2Cu_3O_{7-x}$ layer on a {100} face of a single crystal periclase (MgO) substrate utilizing the YBC-P1 stoichiometric precursor solution.

A coating of the YBC-P1 precursor solution was formed on the MgO substrate by spinning the MgO wafer at 3000 rpm for 20 seconds. The precursor coating was then heated in air to 650° C. in a Fisher Model 495 ashing furnace to decompose the yttrium, barium and copper carboxylates. This coating-heating procedure was performed 7 times in sequence to build a mixed oxide layer of the desired thickness. The yttrium oxide ($Y_2O_3$)-copper oxide (CuO)-barium carbonate (BaCO$_3$) mixed oxide layer was converted to an electrically conductive crystalline YBa$_2$Cu$_3$O$_{7-x}$ single-phase film by heating in air to 1025° C. in the ashing furnace. The sample was held at this temperature for 3 minutes and then allowed to cool slowly at a rate of 6° C. per minute.

After cooling to room temperature the sample was heated in oxygen to 450° C., left to anneal at this temperature for 1 hour and then allowed to cool slowly at a rate of 6° C. per minute. X-ray diffraction analysis of the Y-Ba-Cu layer confirmed that it exhibited a well defined perovskite structure corresponding to Y$_1$Ba$_2$Cu$_3$O$_{7-x}$ phase with a trace amount of BaCO$_4$ phase present. A standard four-probe technique was used to measure film resistance as a function of temperature. Contacts were made using gold bonding pads fabricated by pyrolysis of a gold organometallic precursor (Liquid Bright Gold TM —Englehard Corp.). Results of electrical resistance measurements are shown in FIG. 6.

Figure 6:
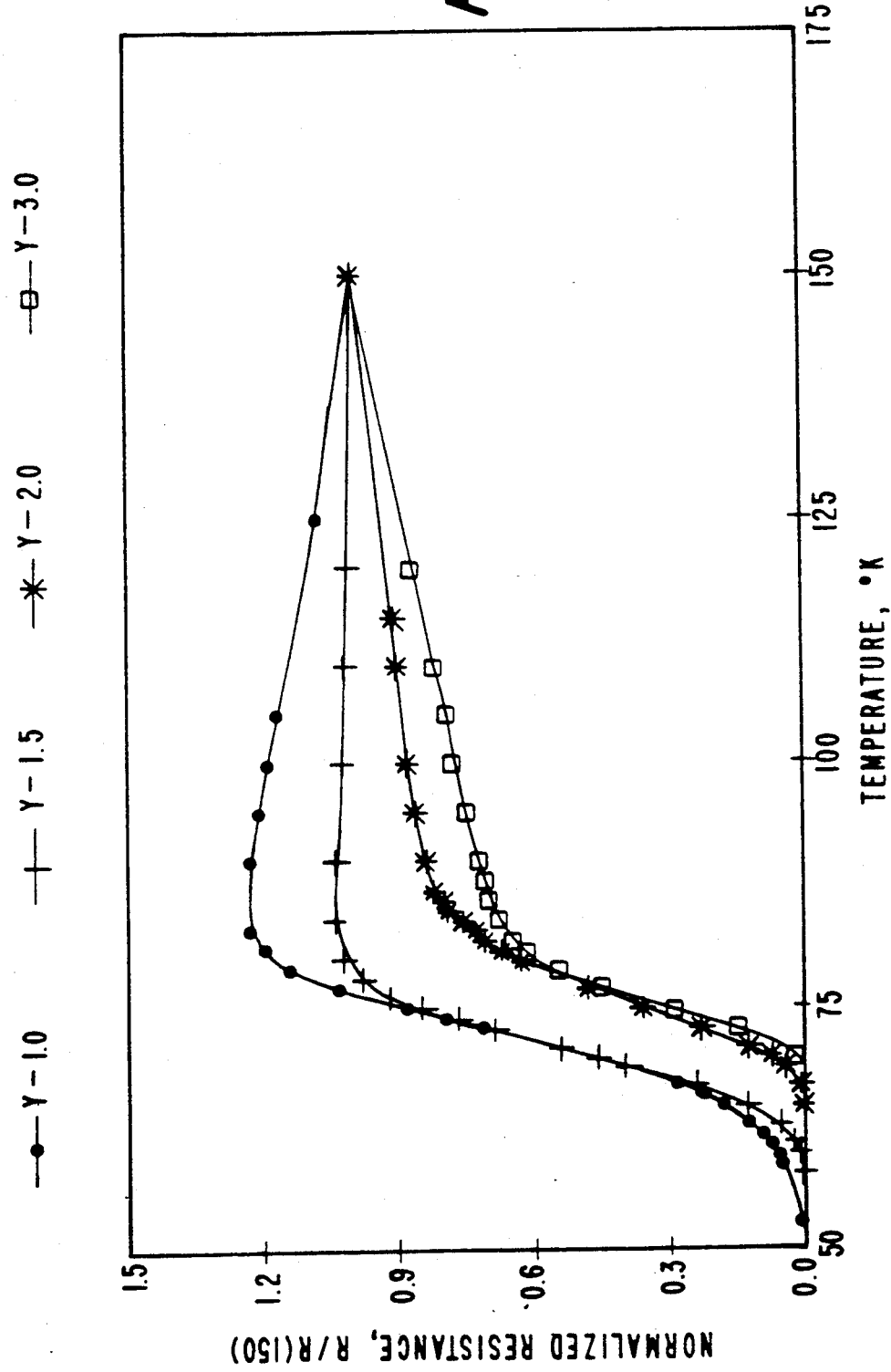
FIG. 6 is a family of plots of resistance normalized at 150° K. versus temperature in degrees Kelvin for films having various yttrium concentrations.

As shown in FIG. 6, the temperature dependence of the resistance of the single phase YBa$_2$Cu$_3$O$_{7-x}$ film is characterized by two distinct regions. In one region, which extends from 150° K. to 85° K., the resistance increases as the temperature decreases. This temperature dependence is similar to that observed for semiconducting materials. In the second region (T ≦ 85° K.), one can observe the onset of a superconductive state (T$_c$), however the transition is broad and the sample reaches a zero resistance state T$_o$, at 55° K.

EXAMPLES 8-10

These examples illustrate the preparation of a high T$_c$, high T$_o$, electrically conductive article having a multiphase crystalline layer on a {100} face of a single crystal MgO substrate, the layer comprising a YBa$_2$Cu$_3$O$_{7-x}$ phase and a Y$_2$BaCuO$_5$ phase, utilizing precursors having excess yttrium with respect to the YB$_2$C$_3$ phase ratio.

These examples were prepared and characterized as described in Example 7, except that the precursor solutions YBC-P2 through YBC-P4 were employed wherein the ratio of yttrium with respect to the stoichiometric quantity of yttrium in accordance with the YB$_2$C$_3$ phase was increased as given in Table II.

TABLE II

| Example | Precursor Solution | Film Stoichiometry | | |
|---|---|---|---|---|
| | | Y | Ba | Cu |
| 8 | YBC-P2 | 1.5 | 2 | 3 |
| 9 | YBC-P3 | 2.0 | 2 | 3 |
| 10 | YBC-P4 | 3.0 | 2 | 3 |

It was found that the multiphase yttrium rich films exhibit higher superconducting temperatures (T$_c$ and or T$_o$) than the single phase Y$_1$Ba$_2$Cu$_3$O$_{7-x}$ composition. The temperature dependence of the resistance of the films formulated as described in Table II is shown in FIG. 6. The yttrium rich films show sharper transitions and higher zero resistance temperatures (T$_o$). The films of Examples 9 and 10 also show higher onset temperatures (T$_c$). X-ray diffraction data of the Y$_{1.5}$—Ba$_2$—Cu$_3$—O, Y$_2$—Ba$_2$—Cu$_3$—O and Y$_3$—Ba$_2$—Cu$_3$—O films show the polyphase structures containing at least Y$_2$BaCuO$_5$ and Y$_1$Ba$_2$Cu$_3$O$_{7-x}$ phases.

EXAMPLES 11-30

These examples illustrate the effect of sintering temperature on the zero resistance temperature, T$_o$, of films prepared by the procedure set forth in Example 7, except that sintering temperatures of 1000° C., 1050° C., 1063° C., 1075° C., 1088° C. and 1100° C. were employed with each of the yttrium precursors (YBC-P1 through YBC-P4). Table III sets forth the composition and sintering temperature for each of these examples. The measured values of T$_o$ are plotted against the sintering temperature for each film composition and shown in FIG. 7. It should be noted that at sintering temperatures above 1050° C. the YBa$_2$Cu$_3$O$_{7-x}$ phase decomposes giving rise to a matrix of needle-like Y$_2$BaCuO$_5$ crystals with a YBa$_2$Cu$_3$O$_{7-x}$ phase on the surface thereof; the yttrium rich samples heated below the decomposition temperature also exhibit the Y$_2$BaCuO$_5$ phase but not with the matrix of needle-like crystals. Also, the stoichiometric YBC-P1 precursor, when sintered at a temperature below the YBa$_2$Cu$_3$O$_{7-x}$ decomposition temperature give rise to single phase YBa$_2$Cu$_3$O$_{7-x}$ films.

TABLE III

| Example | Precursor | Sintering Temperatures, °C. |
|---|---|---|
| 11 | YBC-P1 | 1,000 |
| 12 | YBC-P1 | 1,050 |
| 13 | YBC-P1 | 1,063 |
| 14 | YBC-P1 | 1,075 |
| 15 | YBC-P1 | 1,100 |
| 16 | YBC-P2 | 1,000 |
| 17 | YBC-P2 | 1,050 |
| 18 | YBC-P2 | 1,088 |
| 19 | YBC-P3 | 1,000 |
| 20 | YBC-P3 | 1,050 |
| 21 | YBC-P3 | 1,063 |
| 22 | YBC-P3 | 1,075 |
| 23 | YBC-P3 | 1,088 |
| 24 | YBC-P3 | 1,100 |
| 25 | YBC-P4 | 1,000 |
| 26 | YBC-P4 | 1,050 |
| 27 | YBC-P4 | 1,063 |
| 28 | YBC-P4 | 1,075 |
| 29 | YBC-P4 | 1,088 |
| 30 | YBC-P4 | 1,100 |

Figure 7:
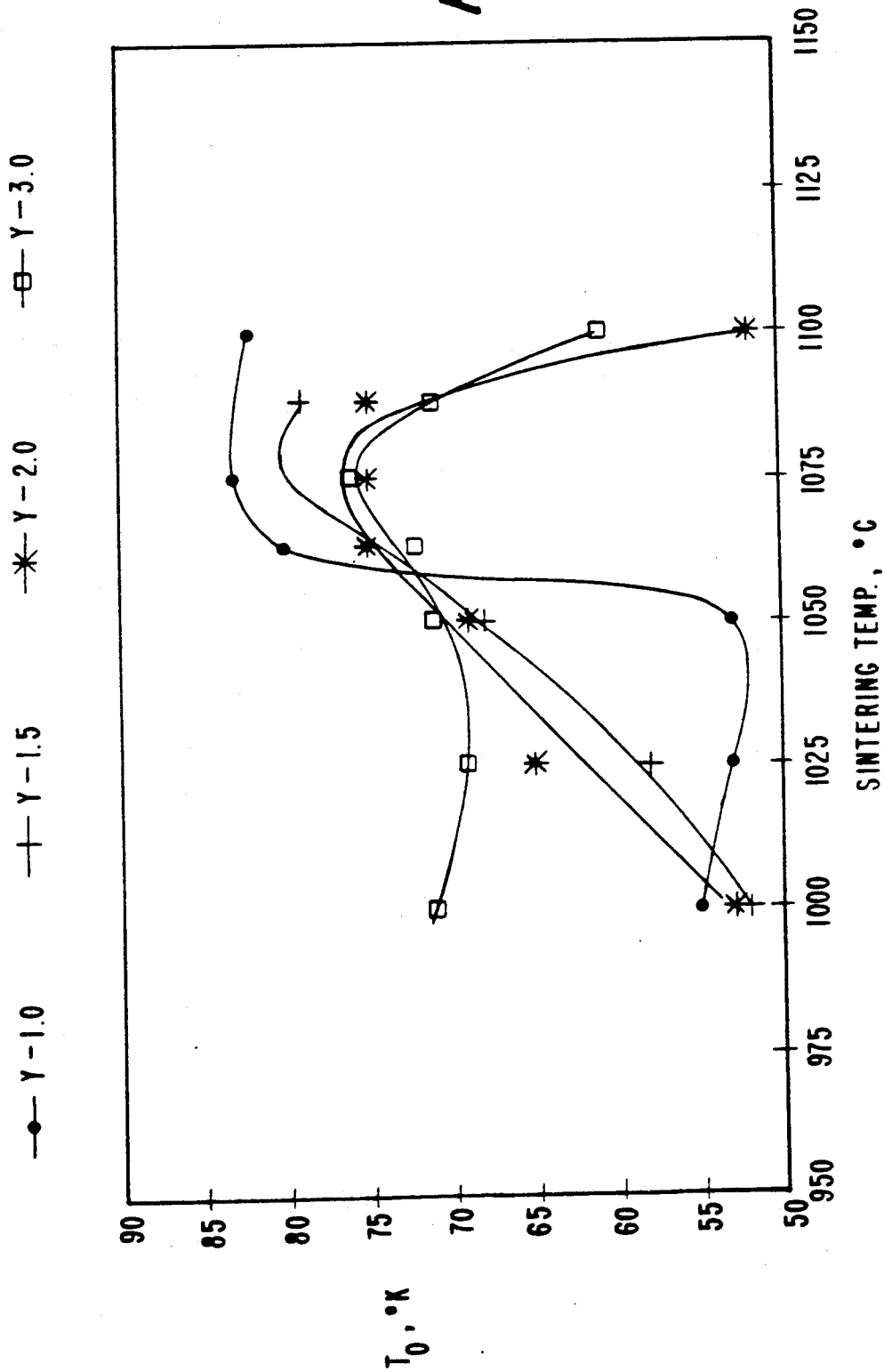
FIG. 7 is a family of plots of $T_o$ (°K.) versus sintering temperature for films having various yttrium concentrations.

As can be seen from FIG. 7, higher zero resistance temperatures are achieved with the polyphase yttrium rich films as compared with the stoichiometric single phase Y$_1$Ba$_2$Cu$_3$O$_{7-x}$ film obtained when the crystallization firing temperature is under the decomposition temperature of the Y$_1$Ba$_2$Cu$_3$O$_{7-x}$ phase. Also, as is apparent from FIG. 8, a plot of T$_o$ as a function of yttrium content for films fired at 1025° C., the higher the yttrium concentration the greater the observed T$_o$.

The invention has been described in detail with particular reference to preferred embodiments thereof, but it will be understood that variations and modifications can be effected within the spirit and scope of the invention.

What is claimed is:
1. A process comprising
   forming a mixed rare earth alkaline earth copper oxide layer on a substrate and
   converting the mixed rare earth alkaline earth copper oxide layer to an electrically conductive layer comprised of a crystalline R$_1$A$_2$C$_3$ oxide phase by heating in the presence of oxygen, wherein rare earth and R is in each instance chosen from among yttrium, lanthanum, samarium, europium, gadolinium, dysprosium, holmium, erbium, thulium, ytterbium, and lutetium and alkaline earth and A is in each instance chosen from among calcium, strontium and barium, characterized in that
   the crystalline $R_1A_2C_3$ oxide phase is first formed and then a crystalline $R_2A_1C_1$ oxide phase is formed by heating the crystalline $R_1A_2C_3$ oxide phase to a temperature in the range of from 1050° to 1300° C.

2. A process according to claim 1 further characterized in that the crystalline $R_1A_2C_3$ oxide phase is heated to a temperature in the range of from 1060° to 1300° C. to form the crystalline $R_2A_1C_1$ oxide phase.

3. A process according to claim 1 further characterized in that
   the molar ratio of rare earth to alkaline earth in the mixed rare earth alkaline earth copper oxide is greater than 1.0:2.0.

4. A process according to claim 3 further characterized in that the molar ratio of rare earth to alkaline earth is in the range of from greater than 1.0:2.0 to 6.0:2.0.

5. A process according to any one of claims 1, 2, 3 and 4 further characterized in that the electrically conductive layer is cooled from a temperature at which the crystalline oxide phases are formed to a temperature in the range of from 750° to 400° C. at a rate of 25° C. or less per minute.

6. A process according to any one of claims 1, 2, 3 and 4 further characterized in that the electrically conductive layer is equilibrated with oxygen following formation of the crystalline oxide phases.

7. A process according to claim 6 further characterized in that the electrically conductive layer is equilibrated with oxygen at a temperature in the range of from 700° to 350° C. for a period of from 20 to 120 minutes.

8. A process according to claim 7 further characterized in that the electrically conductive layer is equilibrated with oxygen at a temperature in the range of from 550° to 450° C.

9. A process according to claims 1, 2, 3 and 4 further characterized in that the rare earth is in each occurrence yttrium.

10. A process according to claim 9 further characterized in that the alkaline earth is in each occurrence barium.

11. A process comprising
   forming a mixed rare earth alkaline earth copper oxide layer on a substrate and
   converting the mixed rare earth alkaline earth copper oxide layer to an electrically conductive layer comprised of a crystalline $R_1A_2C_3$ oxide phase by heating in the presence of oxygen, wherein rare earth and R is in each instance chosen from among yttrium, lanthanum, samarium, europium, gadolinium, dysprosium, holmium, erbium, thulium, ytterbium, and lutetium and alkaline earth and A is in each instance chosen from among calcium, strontium and barium,
characterized in that
   a crystalline $R_2A_1C_1$ oxide phase is first formed as a layer on the substrate and
   the crystalline $R_1A_2C_3$ oxide phase is formed over the crystalline $R_2A_1C_1$ oxide phase by
   coating a mixed rare earth alkaline earth copper oxide on the crystalline $R_2A_1C_1$ oxide phase and
   heating the mixed rare earth alkaline earth copper oxide to a temperature of at least 1000° C.

12. A process according to claim 11 further characterized in that the mixed rare earth alkaline earth copper oxide is heated to a temperature in the range of from 950° C. to 1050° C.

13. A process according to claim 11 further characterized in that
   the molar ratio of rare earth to alkaline earth in the mixed rare earth alkaline earth copper oxide is greater than 1.0:2.0.

14. A process according to claim 13 further characterized in that the molar ratio of rare earth to alkaline earth is in the range of from greater than 1.0:2.0 to 6.0:2.0.

15. A process according to any one of claims 11, 12, 13 and 14 further characterized in that the electrically conductive layer is cooled from a temperature at which the crystalline oxide phases are formed to a temperature in the range of from 750° to 400° C. at a rate of 25° C. or less per minute.

16. A process according to any one of claims 11, 12, 13 and 14 further characterized in that the electrically conductive layer is equilibrated with oxygen following formation of the crystalline oxide phases.

17. A process according to claim 16 further characterized in that the electrically conductive layer is equilibrated with oxygen at a temperature in the range of from 700° to 350° C. for a period of from 20 to 120 minutes.

18. A process according to claim 16 further characterized in that the electrically conductive layer is equilibrated with oxygen at a temperature in the range of from 550° to 450° C.

* * * * *